United States Patent
Blackmon, Jr. et al.

(10) Patent No.: US 6,548,753 B1
(45) Date of Patent: Apr. 15, 2003

(54) FLAME SUPPRESSION CABINET

(75) Inventors: Robert R. Blackmon, Jr., Flower Mound, TX (US); Mark Hendrix, Richardson, TX (US); Andy Low, Southlake, TX (US); Mark Wear, Fort Worth, TX (US); James C. Fair, Lewisville, TX (US)

(73) Assignee: Marconi Communications, Inc., Cleveland, OH (US)

( * ) Notice: Subject to any disclaimer, the term of this patent is extended or adjusted under 35 U.S.C. 154(b) by 151 days.

(21) Appl. No.: 09/587,879

(22) Filed: Jun. 6, 2000

(51) Int. Cl.[7] ............................ H02G 3/08; H05K 7/20
(52) U.S. Cl. .................. 174/50; 174/17 VA; 361/757
(58) Field of Search ........................... 174/50, 17 VA, 174/53, 121 A; 220/3.2, 3.3; 361/724, 690, 694, 704, 752; 454/184

(56) References Cited

U.S. PATENT DOCUMENTS

| | | |
|---|---|---|
| 4,093,818 A | 6/1978 | Thwaites et al. |
| 4,104,433 A | 8/1978 | Kirk et al. |
| 4,194,521 A | 3/1980 | Banta |
| 4,433,732 A | 2/1984 | Licht et al. |
| 4,715,268 A | 12/1987 | Tanner |
| 5,070,119 A | 12/1991 | Nugent, Jr. et al. |
| 5,108,832 A | 4/1992 | Nugent, Jr. et al. |
| 5,130,349 A | 7/1992 | Eswarakrishnan et al. |
| 5,185,103 A | 2/1993 | Eswarakrishnan et al. |
| 5,227,416 A | 7/1993 | Knox et al. |
| 5,476,891 A | 12/1995 | Welna |
| 5,523,059 A | 6/1996 | Langer |
| 5,681,640 A | 10/1997 | Kiser |
| 5,869,010 A | 2/1999 | Langer |
| 5,889,648 A * | 3/1999 | Heavirland et al. ............ 174/50 |
| 5,991,163 A * | 11/1999 | Marconi et al. ............. 361/724 |
| 6,000,464 A * | 12/1999 | Scafidi et al. .............. 174/16.1 |
| 6,002,584 A | 12/1999 | Messmer et al. |
| 6,052,282 A * | 4/2000 | Sugiyama et al. ......... 174/16.1 |
| 6,130,381 A | 10/2000 | Keith et al. |
| 6,283,850 B1 * | 9/2001 | Toshimitsu et al. ......... 361/724 |
| 6,301,095 B1 * | 10/2001 | Laughlin et al. .............. 174/59 |
| 6,327,155 B1 * | 12/2001 | Niepmann et al. .......... 361/752 |

* cited by examiner

*Primary Examiner*—Dean A. Reichard
*Assistant Examiner*—Angel R. Estrada
(74) *Attorney, Agent, or Firm*—Jones Day

(57) ABSTRACT

A flame suppression cabinet for printed circuit boards includes intumescent material that expands at an elevated temperature to block ventilation openings in a top panel. Fire suppression plates are positioned between adjacent ones of a plurality of printed circuit boards positioned vertically on a shelf rack in side-by-side spaced-apart parallel relationship to prevent fire from spreading between the circuit boards.

7 Claims, 7 Drawing Sheets

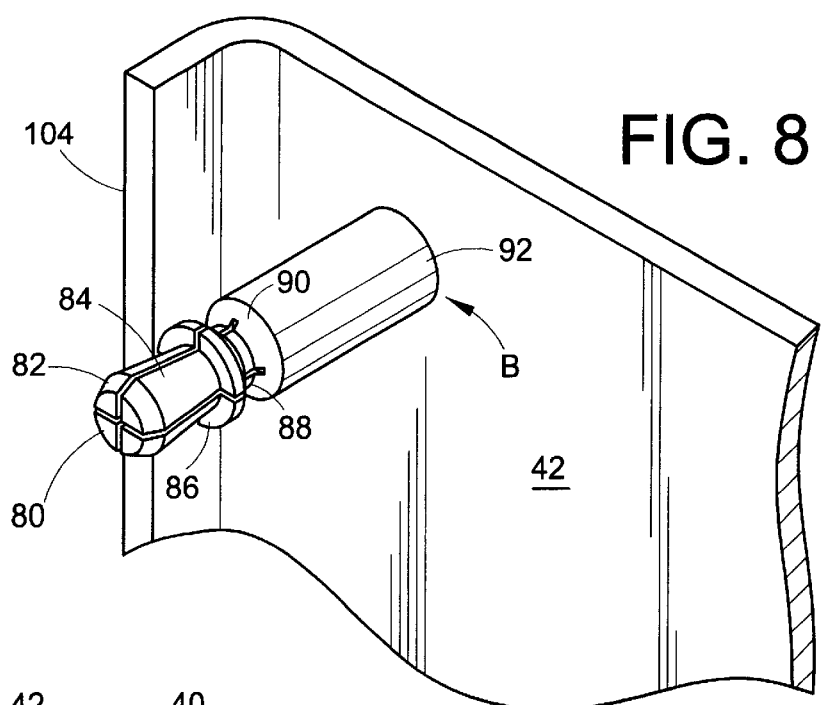
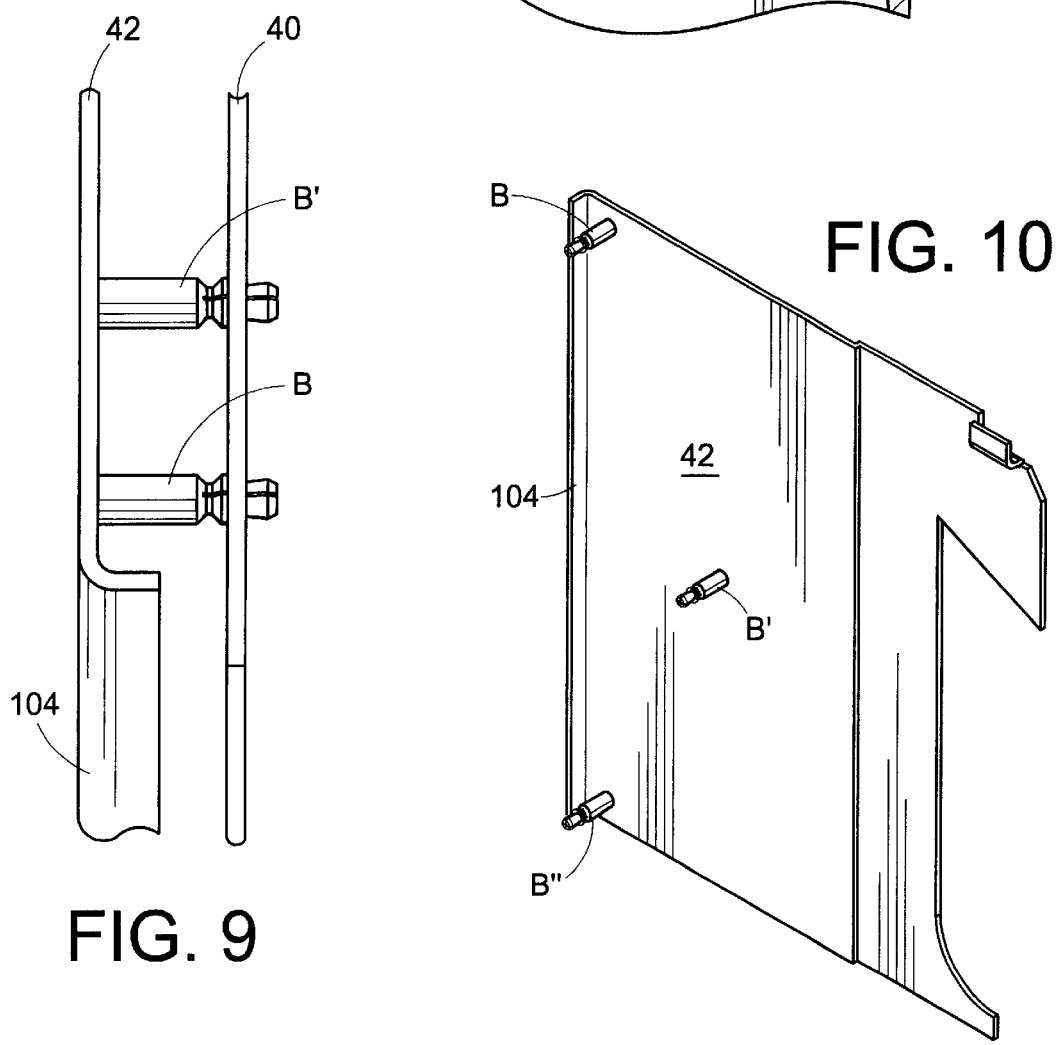

FLAME SUPPRESSION CABINET

BACKGROUND OF THE INVENTION

This application relates to the art of cabinets for enclosing electrical equipment and, more particularly, to fire suppression arrangements for such cabinets. The invention is particularly applicable to electronic chassis or shelf units for supporting telecommunications equipment and will be described with particular reference thereto. However, it will be appreciated that the invention has broader aspects and that features thereof may be used for other purposes in other environments.

Standard requirements for Network Equipment Building Systems are published by Telcordia for telecommunications equipment, and one of the requirements is fire resistance. In the event of a fire within a cabinet that encloses telecommunications equipment, it is both desirable and necessary to prevent the fire from spreading to other equipment, to suppress the fire and to ensure that the fire quickly is extinguished. It would be desirable to have an improved arrangement to satisfy the fire resistance requirements for Network Equipment Building Systems.

SUMMARY OF THE INVENTION

A cabinet in accordance with the present application includes a perforated top panel through which ventilation air normally flows. The inner surface of the perforated top panel is coated with intumescent material which expands at an elevated temperature to close the ventilation openings in a localized area that is influenced by a flame to block the flame against extending through the top panel and thereby prevent spread of the flame, along with inhibiting flow of ventilation air to the source of the fire.

In one arrangement, the top panel has circular holes that provide the ventilation openings and the peripheral surfaces of the holes as well as the inner surface of the top panel are coated with an intumescent material.

In accordance with another aspect of the invention, metal fire plates are positioned between adjacent printed circuit boards to prevent fire from spreading from one circuit board to another. In one arrangement, the fire plates are attached to one side of printed circuit boards in outwardly-spaced relationship thereto. The fire plates are positioned on the side of the printed circuit board that contains electronic components.

In a preferred arrangement, the fire plates are attached to the printed circuit boards by standoff snap fasteners that snap through holes in the printed circuit boards and hold the fire plates in outwardly-spaced relationship to one side of the printed circuit board.

The flame suppression cabinet of the present application includes a shelf rack for supporting a plurality of printed circuit boards that lie in vertical planes and are spaced-apart in a direction between the cabinet sides. Equipment mounted within the cabinet is of the type for linking a Central Office switch and optical network of a telecommunications service provider with individual users of the service. Equipment of the type with which the present invention may be used includes, but is not necessarily limited to, DISC*S channel shelf, DISC*S common shelf, MX MDS shelf and HDD shelf. DISC*S is a registered trademark of Marconi Communications, Inc. Obviously, the invention can be used for any type of cabinet in which electronic equipment is enclosed and through which ventilation air normally flows.

It is a principal object of the present invention to provide an improved flame suppressing cabinet for enclosing electronic equipment.

It is another object of the invention to provide an improved fire suppression plate arrangement for printed circuit boards.

It is also an object of the invention to provide a cabinet for telecommunications equipment that meets or exceeds the fire resistance requirements that are promulgated by Telcordia for Network Equipment Building Systems.

BRIEF DESCRIPTION OF THE DRAWING

FIG. 8 is a perspective illustration of a stand-off fastener used for attaching metal fire plates to one side of printed circuit boards;

FIG. 9 is a partial top and rear elevational view showing the standoff fasteners attaching a metal fire suppression plate to a printed circuit board in outwardly-spaced parallel relationship thereto;

FIG. 10 is a perspective illustration of a fire suppression plate and a plurality of standoff fasteners associated therewith;

DESCRIPTION OF A PREFERRED EMBODIMENT

Figure 1:
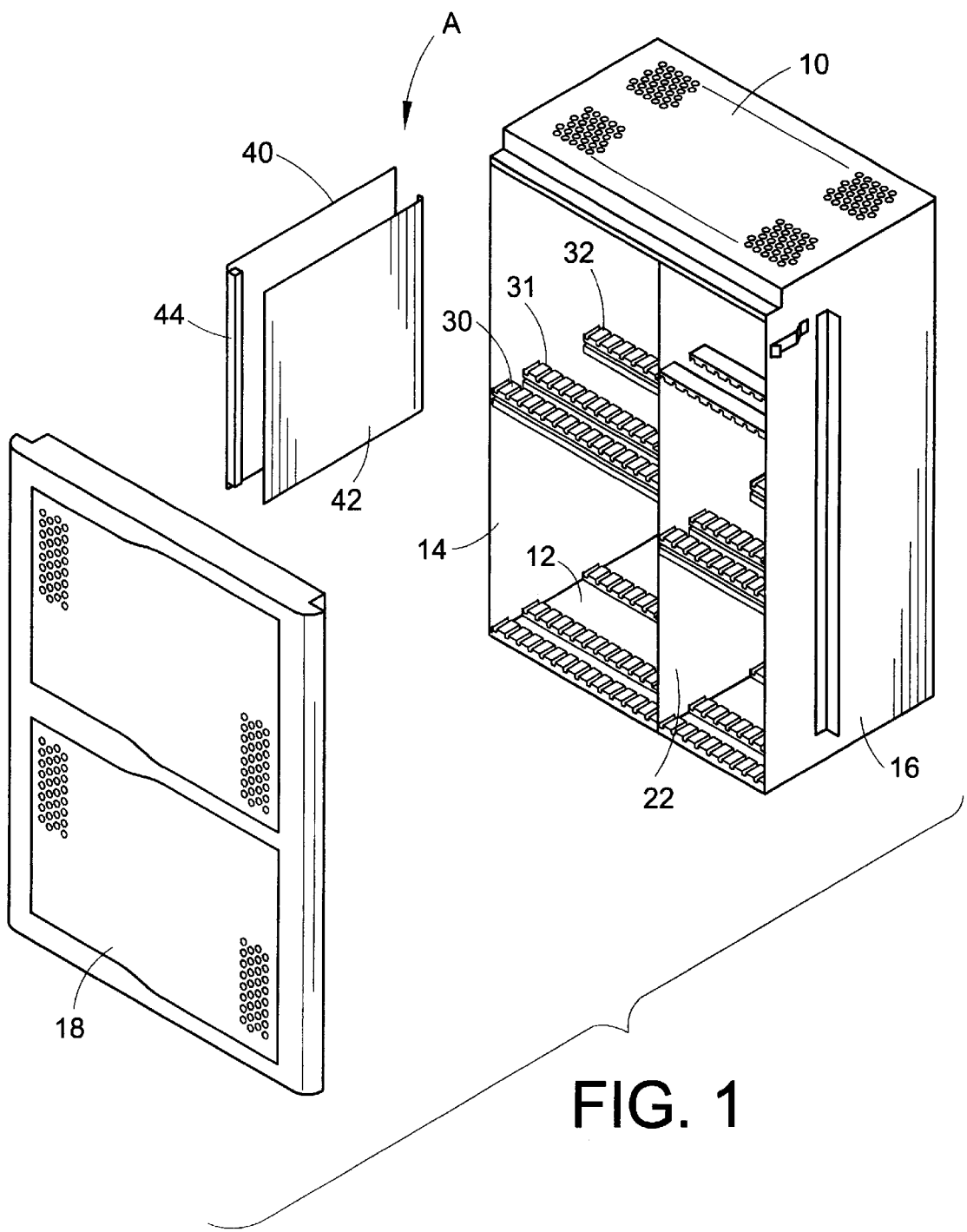
FIG. 1 is a perspective illustration of a flame suppression cabinet constructed in accordance with the present application.

Referring now to the drawing, wherein the showings are for purposes of illustrating a preferred embodiment of the invention only and not for purposes of limiting same, FIG. 1 shows a fire suppression cabinet A having a shelf rack therein for supporting a plurality of printed circuit boards. Flame suppression cabinet A includes perforated top and bottom panels 10,12, imperforate opposite side panels 14,16, a perforated front cover panel 18, and an imperforate rear panel 20 shown in FIG. 3. In the cabinet shown, a vertical divider panel 22 is provided for separating the interior of the cabinet into a plurality of different shelf racks. Cover panel 18 is perforated for permitting viewing of light emitting diodes and the like and not for ventilation purposes.

Figure 2:
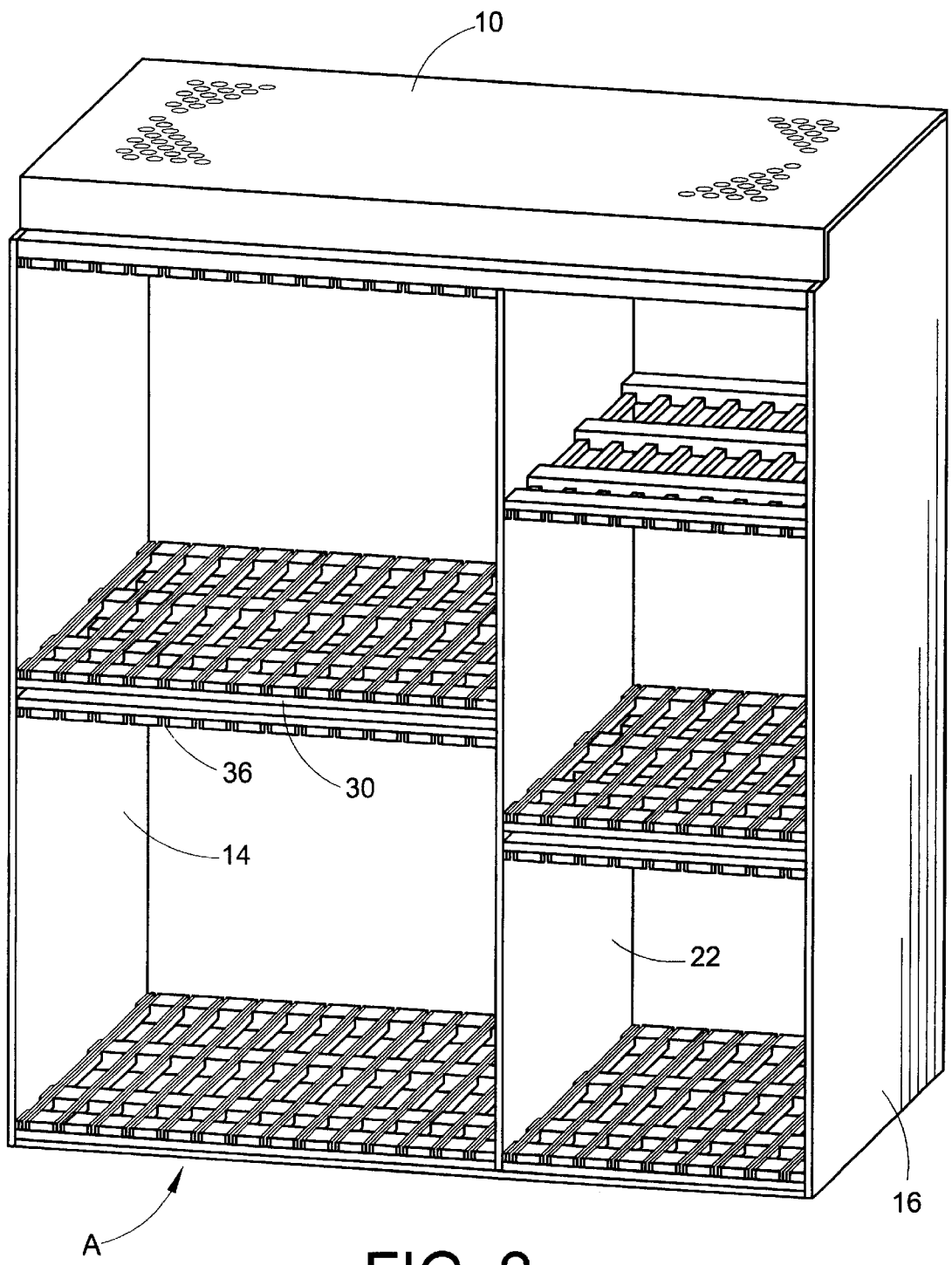
FIG. 2 is a front elevational view looking downwardly into a shelf rack in the cabinet of FIG. 1.

The interior of Cabinet A has a plurality of horizontal support bars extending in a direction between opposite side panels 14,16, and only three of such support bars are identified by numerals 30, 31 and 32 in FIG. 1. The upper surfaces of the support bars have grooves or channels therein that extend in a direction from front-to-back of the cabinet and are spaced-apart from one another in a direction between opposite side panels, 14,16. The channels receive tracks as indicated generally at 36 in FIG. 2. Thus, a plurality of spaced-apart parallel tracks 36 extend in a direction from front-two-rear of the cabinet for receiving a bottom edge of a printed circuit board. Corresponding tracks are provided in opposed relationship to tracks 36 for supporting the upper edges of the printed circuit boards. The upper tracks are illustrated in FIG. 3, and only one such upper track is identified by a numeral 36a.

Flat printed circuit board 40 is oriented in a vertical plane with its upper and lower edges slidably received within tracks 36, 36a. A plurality of side-by-side parallel printed circuit boards are received in the tracks in the shelf rack as shown in FIG. 3. A metal fire plate 42 is attached to one side of each printed circuit board in outwardly-spaced relationship thereto, and only one such fire plate is generally indicated by numeral 42 in FIG. 3.

Figure 4:
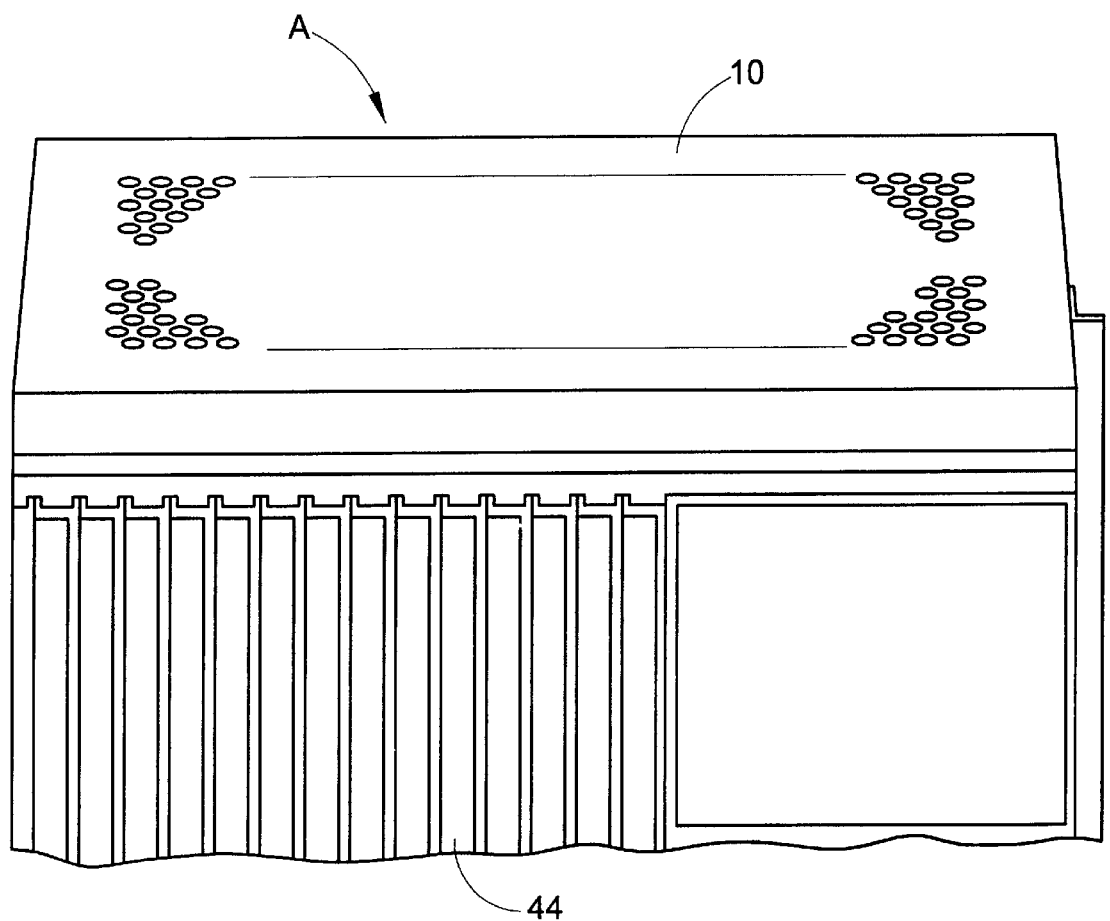
FIG. 4 is a top plan view showing the perforated top panel on the cabinet.

Each printed circuit board has a metal face plate attached to the front vertical end thereof, and only one such face plate is identified by a number 44 in FIGS. 1 and 4. As shown in FIG. 4, the face plates on the front vertical edges of the printed circuit boards are positioned in very close side-by-side relationship. This channels the flow of ventilation air upwardly through perforated bottom panel 12, past the printed circuit boards and fire plates, and out through perforated top panel 10.

Figure 3:
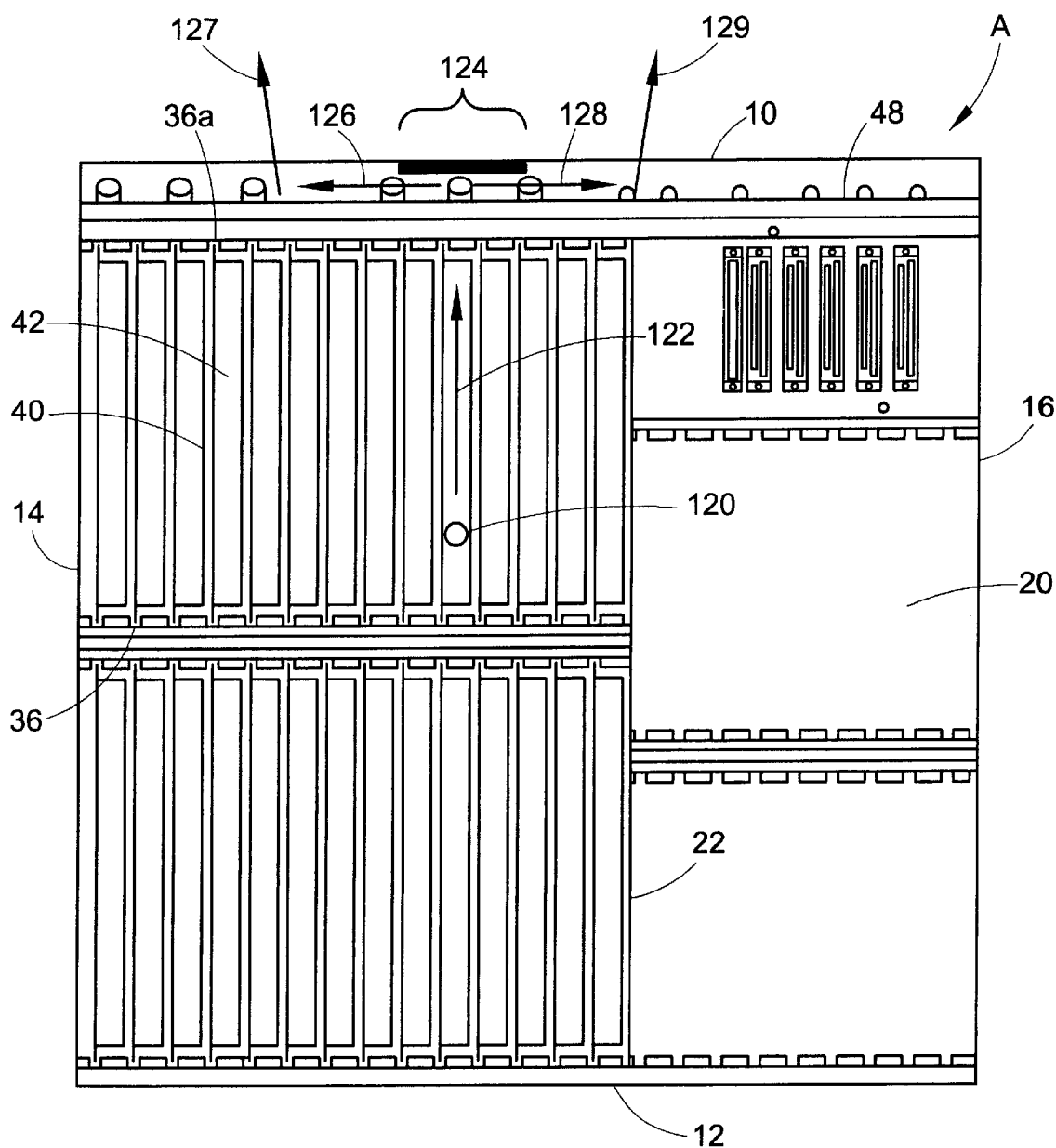
FIG. 3 is a front elevational view of the cabinet.

A perforated sheet 48 that provides an electromagnetic interference barrier extends across the upper portion of cabinet A as shown in FIG. 3. Perforated top panel 10 is spaced above electromagnetic interference barrier 48. Cabinet A is assembled with other equipment that includes a fan located beneath perforated bottom panel 12 for circulating ventilation air upwardly through perforated bottom panel 12 and out perforated top panel 10. The ventilation air flows upwardly over and past all of the printed circuit boards for cooling the electronic components thereon.

Figure 5:
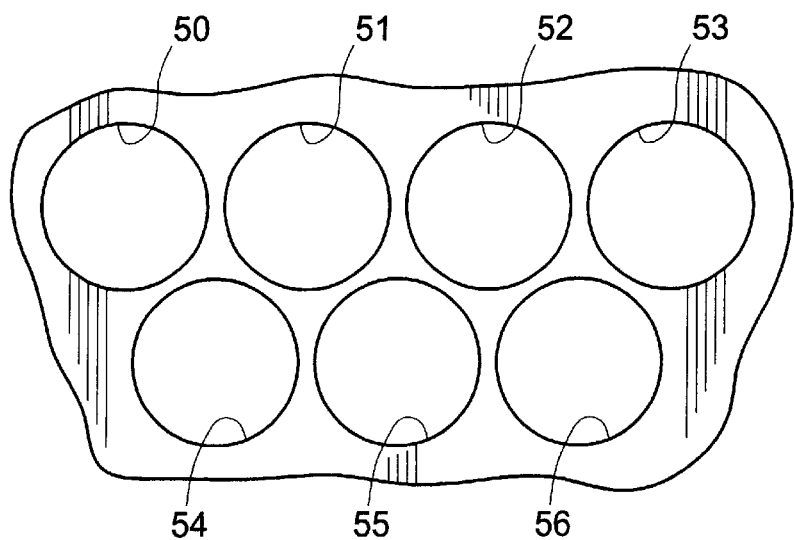
FIG. 5 is a partial plan view showing ventilation openings in the top panel of the flame suppression cabinet.

Top panel 10 has a plurality of ventilation openings therethrough. Although the ventilation openings may be of other shapes, a preferred arrangement provides circular holes for the ventilation openings. Obviously, the holes may be of varying diameters and spacings, and dimensions are provided simply by way of example and not by way of limitation. In one arrangement, circular ventilation openings 50–56 of FIG. 5 have a diameter of 5/32 inches and are spaced on 3/16th inch staggered centers. The arrangement provides 33 circular ventilation openings per square inch of area in top panel 10. The area occupied by the ventilation openings is at least 50% open area and, with the hole diameter and spacing in the example, the open area is 63%. As shown in FIG. 5, ventilation openings 50–53 are aligned in one row, while openings 54–56 are aligned in an adjacent row and are staggered relative to openings 50–53 by being located midway therebetween.

Figure 6:
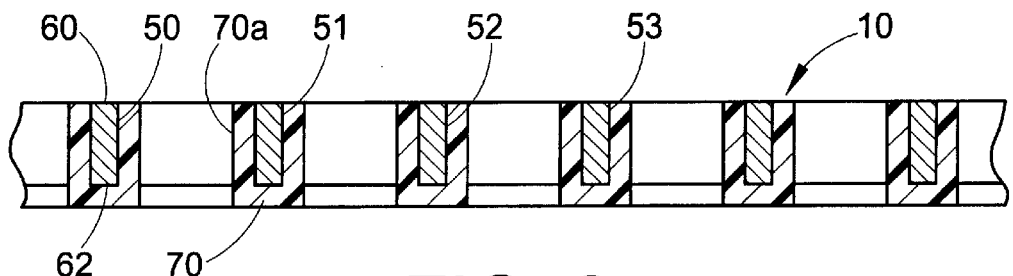
FIG. 6 is a partial cross-sectional elevational view showing the ventilation openings in the cabinet top panel, and with an intumescent coating on the interior surface thereof and on the peripheral surfaces of the openings.
Figure 7:
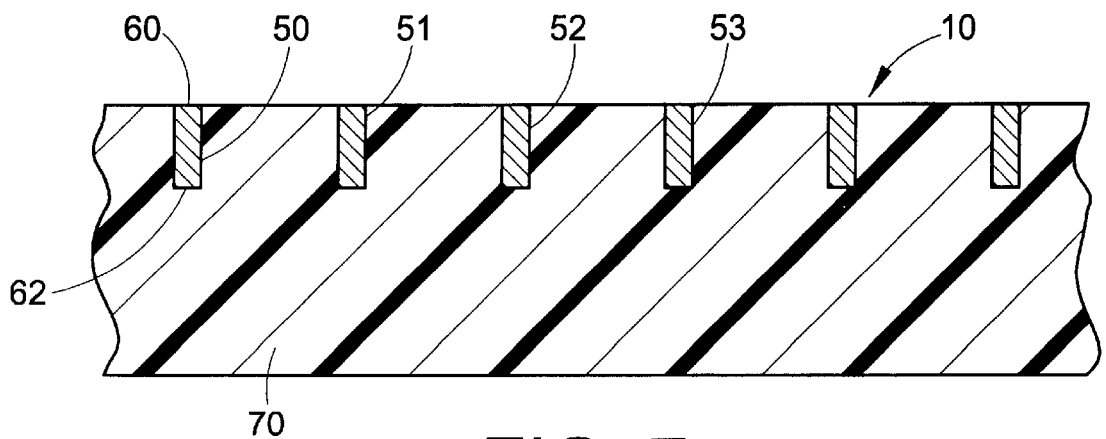
FIG. 7 is a view similar to FIG. 6 showing the intumescent material after it has expanded responsive to an elevated temperature to close the ventilation openings.

With reference to FIGS. 6 and 7, top panel 10 has outer and inner surfaces 60,62 between which the ventilation openings extend. Inner surface 60 is provided with a coating of intumescent paint 70 that also extends into the ventilation openings to coat the peripheral surfaces thereof as generally indicated at 70a for ventilation opening 50. Many different types of intumescent coatings may be used in the flame suppression cabinet of the present application. One material that has been used is known as FX100 Super Intumescent Flame Retardant Coating for nonporous surfaces as marketed by Flame Seal Products, Inc. This material is capable of expanding up to 100 times the original coating thickness and begins to intumesce at approximately 380° F. Obviously, the temperature at which the material intumesces may vary.

In the event of a fire or over-temperature condition within the cabinet, the intumescent material expands as shown in FIG. 7 to completely close all of the ventilation openings in a localized area that is exposed to an applied flame for blocking the flame from exiting top panel 10 in that area and thereby minimize the possibility of flame propagation to other equipment. Thus, top panel 10 is closed above the printed circuit board or boards that are on fire and this inhibits flow of ventilation air upwardly past those boards. Lateral deflection of a flame along the underside of top panel 10 will result in activation of larger areas of the intumescent material to close larger areas of the ventilation openings or the entire top panel. Ventilation openings remote from the fire or flame that remain open allow the escape of heat to minimize the possibility of damage to components that are not on fire.

Although sheet metal top panel 10 may be of any desired thickness, a typical thickness used in equipment of the type described is 0.0015–0.0050 inches. The thickness of the intumescent coating also may vary. By way of example and not by way of limitation, the intumescent coating may have a thickness of 0.001–0.0055 inches. The intumescent material also coats the periphery of each ventilation opening and reduces the size thereof from approximately 0.156 inches to 0.145–0.154 inches. This does not appreciably reduce the total open area provided in the top panel by the ventilation openings.

Other examples of intumescent coating compositions, the disclosures of which are hereby incorporated herein by reference, include the following U.S. Pat. Nos. 4,104,433; 5,130,349; 5,108,832; 5,185,103; 5,227,416 and 5,476,891. Instead of coating the surface of the top panel with intumescent material, it may be possible to bond a perforated sheet of intumescent material to the inner surface thereof or to position a perforated sheet of intumescent material between the top panel and a perforated support panel. Examples of intumescent sheet material, the disclosures of which are hereby incorporated herein by reference, include the following U.S. Pat. Nos. 4,433,732; 5,523,059; 5,681, 640 and 5,869,010.

FIG. 8 shows a generally cylindrical standoff fastener B having a flat front end 80 surrounded by an outwardly sloping cam surface 82 that intersects an inwardly sloping surface 84 that in turn intersects an outwardly extending abutment 86. A reduced diameter portion 88 extends between abutment 86 and a shoulder 90. Cruciform slots extend from front end 80 to shoulder 90 for providing four resilient segments that are movable toward the axis of cylindrical standoff fastener B for permitting insertion of the front-end portion thereof through a hole in a printed circuit board. Cam surface 82 facilitates movement of the front end portion through the hole and cams the segments inwardly toward one another. Once the front end portion is through the hole, the segments expand outwardly for releaseable retention within the hole. Obviously, the holes in the printed circuit board have a diameter smaller than the generally circular intersection between reversely sloping surfaces 82, 84 while being larger than the diameter of fastener front end 80. The standoff fasteners effectively have snap fastener front end portions that snap through the holes in the printed circuit board. Sloping surface 84 cooperates with the hole periphery to pull the fastener end portion further into the hole under the biasing force of the segments and engage abutment 86 with the surface of the printed circuit board.

Figure 11:
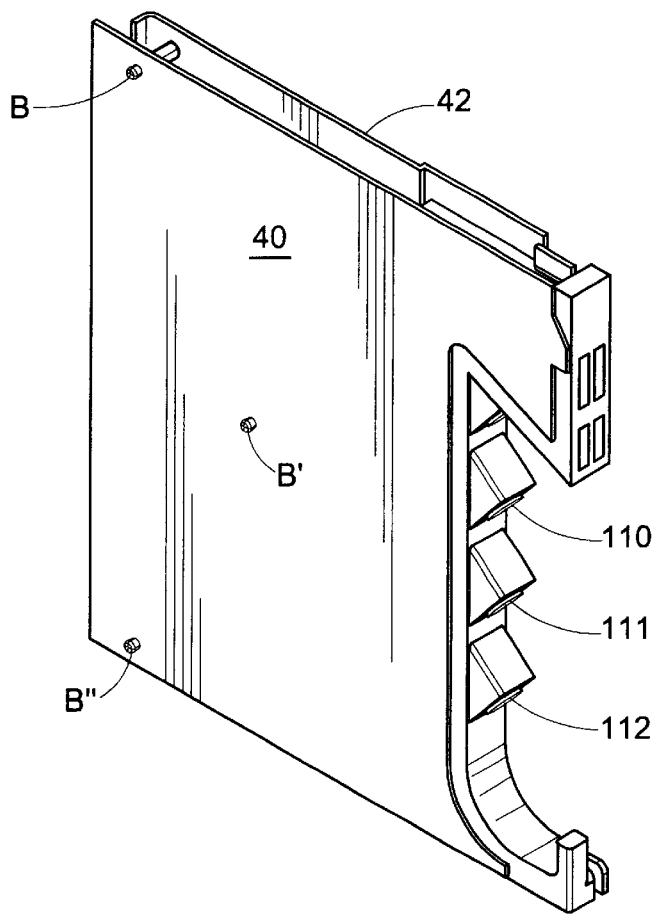
FIG. 11 is a perspective illustration of a printed circuit board having a fire suppression plate attached thereto.
Figure 12:
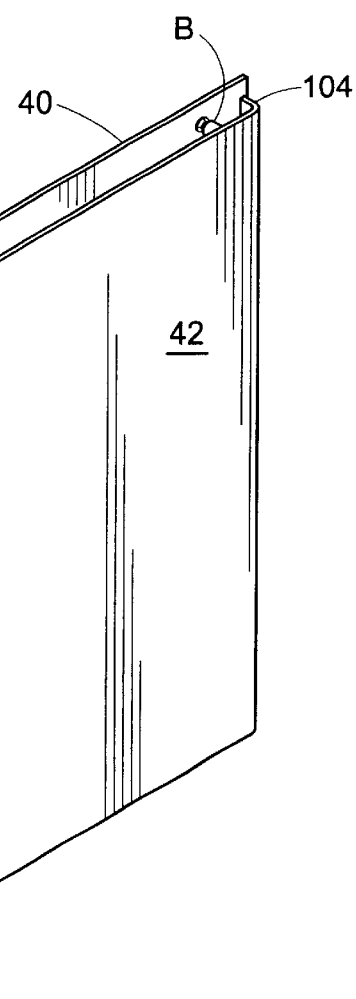
FIG. 12 is another perspective illustration of a printed circuit board having a fire suppression plate attached thereto.

Rear end 92 of standoff fastener B is welded or otherwise suitably secured to one surface of metal fire plate 42 which has a rear vertical flange 104 extending toward printed circuit board 40. Two standoff fasteners B and B' are shown in FIG. 9 with the front end portions thereof snapped through suitable circular holes in printed circuit board 40. The abutments on the standoff fasteners engage one side of the printed circuit board while the remainder of the front end portions of the fasteners extend through the printed circuit board holes. FIG. 10 shows three standoff fasteners B, B' and B" attached to an inner surface of metal fire plate 42. The printed circuit board and the fire plate for use therewith as shown in FIGS. 10–12 is known as a quad optical interface unit. As shown in FIGS. 11 and 12, this unit has a recessed front end with downwardly extending inclined sockets 110, 111 and 112 for receiving connectors on fiber optic cables.

The printed circuit boards have electronic components attached to one side thereof and the fire suppression plate is attached to the same side of the board as the electronic components. Thus, the electronic components are located between the printed circuit board and the fire suppression plate. The size of the fire plates is such that they are at least coextensive in area with a printed circuit board. When the fire plates are part of the cabinet, they may be larger than the circuit boards.

It will be recognized that the fire suppression plates may be mounted or assembled within the cabinet itself instead of being attached to the printed circuit boards. The important consideration is that of preventing the spread of fire from one circuit board to another by providing fire plates between the circuit boards.

By way of example, FIG. 3 shows a flame source 120 that produces a flame 122 which activates the intumescent material to close an area 124 of top panel 10 while heat escapes as generally indicated by arrows 126–129. Lateral spreading of the flame or excessive heat will activate more intumescent material and enlarge closed area 124.

Although the invention has been shown and described with reference to a preferred embodiment, it is obvious that equivalent alterations and modifications will occur to others skilled in the art upon the reading and understanding of this specification. The present invention includes all such equivalent alterations and modifications, and is limited only by the scope of the claims.

We claim:

1. A flame suppression cabinet for printed circuit boards, said cabinet having top and bottom panels, opposite side panels, a rear panel and a front cover panel, at least one shelf rack extending in a direction between said opposite side panels to support a plurality of spaced-apart side-by-side printed circuit boards, said top panel having inner and outer surfaces, said inner surface facing inwardly of said cabinet toward said shelf rack, said top panel having ventilation openings therein extending between said inner and outer surfaces thereof, said ventilation openings having opening peripheries, a coating of intumescent material on said inner surface and on said opening peripheries, said outer surface being free of any coating of intumescent material, said intumescent material expending at an elevated temperature to close said ventilation openings, a plurality of spaced-apart side-by-side parallel printed circuit boards supported on said shelf rack, a metal fire suppression plate attached to each said printed circuit board in parallel outwardly-spaced relationship thereto, each said metal fire suppression plate having a plurality of standoff fasteners attached thereto and extending outwardly therefrom, said standoff fasteners having snap fastener end portions, and each said printed circuit board having a plurality of holes therein receiving said snap fastener end portions with a snap fit.

2. The cabinet of claim 1 wherein said standoff fasteners are welded to said metal fire suppression plates.

3. A flame suppression cabinet for printed circuit boards, said cabinet having top and bottom panels, opposite side panels, a rear panel and a front cover panel, at least one shelf rack extending in a direction between said opposite side panels to support a plurality of spaced-apart side-by-side printed circuit boards, said top panel including a sheet of intumescent material having ventilation openings therein, said sheet of intumescent material expanding at an elevated temperature to close said ventilation openings, a plurality of spaced-apart side-by-side parallel printed circuit boards supported on said shelf rack, a metal fire suppression plate attached to each said printed circuit board in parallel outwardly-spaced relationship thereto, each said metal fire suppression plate having a plurality of standoff fasteners attached thereto and extending outwardly therefrom, said standoff fasteners having snap fastener end portions, and each said printed circuit board having a plurality of holes therein receiving said snap fastener end portions with a snap fit.

4. The cabinet of claim 3 wherein said standoff fasteners are welded to each said metal fire suppression plate.

5. A printed circuit board having opposite sides, a metal fire suppression plate attached to said board in outwardly-spaced parallel relationship to one of said board sides, said metal fire suppression plate having a plurality of standoff fasteners attached thereto and extending outwardly therefrom toward said board, said board having a plurality of holes therein, and said standoff fasteners having snap fastener end portions received in said holes with a snap fit.

6. The printed circuit board of claim 5 wherein said standoff fasteners are welded to one side of said metal fire suppression plate.

7. The printed circuit board of claim 6 wherein said snap fastener end portions have cruciform slots therein and cam surfaces that facilitate insertion of said snap fastener end portions through said holes.

* * * * *